United States Patent
Kim et al.

(10) Patent No.: US 7,763,984 B2
(45) Date of Patent: Jul. 27, 2010

(54) SEMICONDUCTOR PACKAGE AND METHOD FOR MANUFACTURING THE SAME

(75) Inventors: Jong Hoon Kim, Gyeonggi-do (KR); Joon Won Kim, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 225 days.

(21) Appl. No.: 11/853,312

(22) Filed: Sep. 11, 2007

(65) Prior Publication Data
US 2009/0001605 A1 Jan. 1, 2009

(30) Foreign Application Priority Data
Jun. 26, 2007 (KR) .................. 10-2007-0063261

(51) Int. Cl.
*H01L 23/48* (2006.01)
(52) U.S. Cl. ............... 257/778; 257/E21.705; 257/E23.003; 438/108
(58) Field of Classification Search ........... 257/778, 257/E21.705, E23.003; 438/108
See application file for complete search history.

(56) References Cited

U.S. PATENT DOCUMENTS

| | | | |
|---|---|---|---|
| 6,815,258 B2 | 11/2004 | Vincent | |
| 2002/0030249 A1* | 3/2002 | Yoshida et al. | 257/659 |
| 2002/0030261 A1* | 3/2002 | Rolda et al. | 257/685 |
| 2003/0137062 A1* | 7/2003 | Akram et al. | 257/788 |

FOREIGN PATENT DOCUMENTS

| | | |
|---|---|---|
| JP | 2005-353672 A | 12/2005 |
| KR | 1020010054743 A | 7/2001 |
| KR | 1020050047138 A | 5/2005 |

\* cited by examiner

*Primary Examiner*—Trung Dang
(74) *Attorney, Agent, or Firm*—Ladas & Parry LLP

(57) ABSTRACT

A semiconductor package and a method for manufacturing the same. The semiconductor package includes a substrate having connection pads formed on one surface thereof, a semiconductor chip having bonding pads formed on one surface thereof to correspond to the connection pads; bumps for electrically connecting the connection pads and the bonding pads with each other, a coating layer located on exposed surface portions of the bonding pads and the connection pads to prevent voids from being formed in spaces between the substrate and the semiconductor chip, and an underfill member filled in the spaces over the coating layer.

10 Claims, 2 Drawing Sheets

SEMICONDUCTOR PACKAGE AND METHOD FOR MANUFACTURING THE SAME

CROSS-REFERENCE TO RELATED APPLICATIONS

The present application claims priority to Korean patent application number 10-2007-0063261 filed on Jun. 26, 2007, which is incorporated herein by reference in its entirety.

BACKGROUND OF THE INVENTION

The present invention relates to a semiconductor package and a method for manufacturing the same.

These days, semiconductor packages having semiconductor devices capable of storing a large amount of data and processing stored data in a short period have been developed. Semiconductor packages having semiconductor devices are being applied to personal computers, television receivers, electric home appliances, information communication equipment, and so forth.

In general, semiconductor packages are manufactured through a semiconductor chip manufacturing process in which semiconductor chips are formed by integrating transistors, resistors, capacitors, etc. into a semiconductor wafer. Then, a packaging process in which the semiconductor chips are individually separated from the wafer and are electrically connected with outside circuit boards which are packaged such that the highly brittle semiconductor chips may be protected from external shocks and vibrations.

Recently, with the development of semiconductor packaging technologies, a "flip chip package", which has substantially the same size as a semiconductor chip, has been disclosed in the art. The flip chip package has a size that is no greater than 100% to 110% of the size of a semiconductor chip.

The conventional flip chip package has a construction in which the bonding pads located on a semiconductor chip, and the connection pads formed on a printed circuit board, are electrically connected with each other by means of bumps instead of conductive wires.

The flip chip package, in which the bonding pads of the semiconductor chip and the connection pads of the printed circuit board are electrically connected with each other by means of the bumps, provides an advantage in that data may be stored and/or processed at a high speed.

In a conventional flip chip package, since the bonding pads of the semiconductor chip and the connection pads of the printed circuit board are electrically connected with each other only by means of the bumps, the bumps, which connect the bonding pads and the connection pads, are likely to be easily broken by externally applied shocks and/or vibrations.

In order to prevent the bumps from being easily broken by externally applied shocks and/or vibrations, in another conventional flip chip package, an underfill member formed of an underfill material is located between the semiconductor chip and the printed circuit board.

Because the semiconductor chip and the printed circuit board are firmly attached to each other due to the presence of the underfill member, the reliability of the flip chip package may be improved.

Recently, the size of the semiconductor chip included in the flip chip package is being markedly decreased, and the number of bonding pads formed in the semiconductor chip is being rapidly increased. According to this, the size of the bonding pad and the interval between the bonding pads are also being considerably decreased. Further, as the size of the bonding pad and the interval between the bonding pads are decreased, the size of the bump, which connects the bonding pad of the semiconductor chip and the connection pad of the printed circuit board, is also being decreased.

If the size of the bump connecting the bonding pad and the connection pad is decreased, the gap between the semiconductor chip and the printed circuit board of the flip chip package cannot but be decreased in conformity with the decrease in the size of the bump.

If the gap between the semiconductor chip and the printed circuit board is decreased, it becomes difficult to fill the underfill material between the semiconductor chip and the printed circuit board. Also, even when the underfill member is formed by filling the underfill material between the semiconductor chip and the printed circuit board, a plurality of voids are likely to be created in the underfill member.

Moisture may leak into the voids created in the underfill member, and the moisture collected in the voids may induce cracks which are detrimental to the underfill member as it expands in a subsequent annealing process.

SUMMARY OF THE INVENTION

An embodiment of the present invention is directed to a semiconductor package which improves the reliability of an underfill member interposed between a semiconductor chip and a printed circuit board.

Another embodiment of the present invention is directed to a method for manufacturing a semiconductor package which improves the reliability of an underfill member interposed between a semiconductor chip and a printed circuit board.

In one aspect of the present invention, a semiconductor package comprises a substrate having connection pads formed on one surface thereof; a semiconductor chip having bonding pads formed on one surface thereof to correspond to the connection pads; bumps for electrically connecting the connection pads and the bonding pads with each other; a coating layer located on the one surface of the substrate and the one surface of the semiconductor chip, respectively; an underfill member filled in spaces between the substrate and the semiconductor chip over the coating layer.

The underfill member and the coating layer contain a hydrophilic material or a hydrophobic material.

The coating layer is also formed on exposed surface portions of the bumps.

The substrate and the semiconductor chip are molded using a molding material.

In another aspect of the present invention, a method for manufacturing a semiconductor package comprises the steps of connecting connection pads formed on one surface of a substrate and bonding pads formed on one surface of a semiconductor chip by means of bumps; applying a coating material and thereby forming a coating layer on the one surface of the substrate and the one surface of the semiconductor chip; and filling an underfill material in spaces between the one surface of the substrate and the one surface of the semiconductor chip over the coating layer and thereby forming an underfill member.

In the step of forming the coating layer and the step of forming the underfill member, the coating material and the underfill material contain a hydrophilic material.

In the step of forming the coating layer and the step of forming the underfill member, the coating material and the underfill material contain a hydrophobic material.

In the step of forming the coating layer, the coating layer is formed through a vacuum deposition process or a spin coating process.

The coating layer is also formed on exposed surface portions of the bumps.

In still another aspect of the present invention, a method for manufacturing a semiconductor package comprises the steps of forming connection pads on one surface of a substrate and bonding pads on one surface of a semiconductor chip; applying a coating material and thereby forming a coating layer on the one surface of the substrate and the one surface of the semiconductor chip; connecting the connection pads and the bonding pads with each other by means of bumps; and forming an underfill member by filling an underfill material in a space between the substrate and the semiconductor chip over the coating layer.

DESCRIPTION OF SPECIFIC EMBODIMENTS

Figure 1:
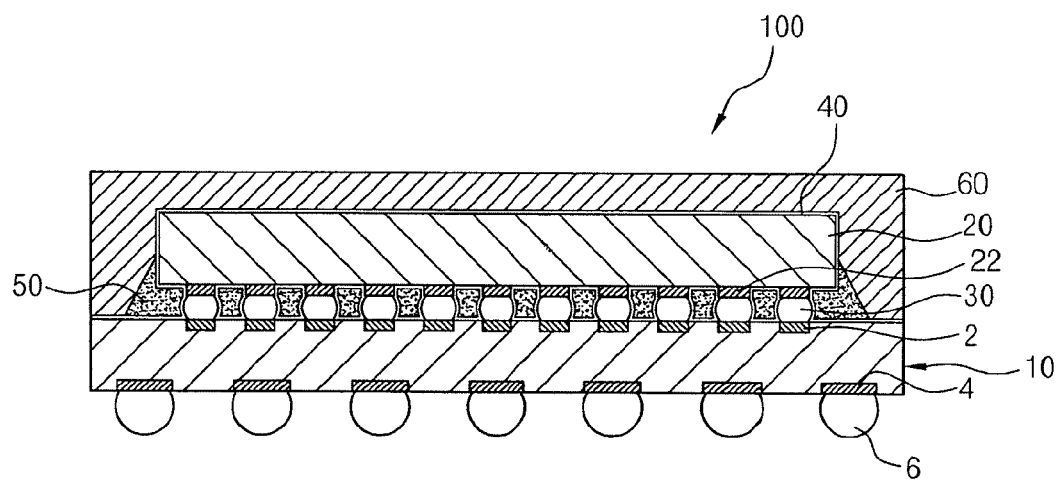
FIG. 1 is a cross-sectional view illustrating a semiconductor package in accordance with an embodiment of the present invention.

FIG. 1 is a cross-sectional view illustrating a semiconductor package in accordance with an embodiment of the present invention.

Referring to FIG. 1, a semiconductor package 100 includes a substrate 10, a semiconductor chip 20, bumps 30, a coating layer 40, and an underfill member 50. In addition, the semiconductor package 100 may further include a molding member 60.

The substrate 10 has connection pads 2, ball lands 4, and solder balls 6.

For example, the substrate 10 may be a printed circuit board. A plurality of connection pads 2 is located on the upper surface of the substrate 10. The ball lands 4 are located on the lower surface of the substrate 10 which faces away from the upper surface, and are electrically connected with the connection pads 2. The solder balls 6 are electrically connected to the ball lands 4.

The semiconductor chip 20 faces the upper surfaces of the substrate 10. The semiconductor chip 20 has a data storage section (not shown) for storing data, a data processing section (not shown) for processing data, and bonding pads 22. The bonding pads 22 are electrically connected with the data storage section and the data processing section.

In the present embodiment, the bonding pads 22 of the semiconductor chip 20 respectively face the connection pads 2 of the substrate 10.

The bumps 30 connect electrically, physically and mechanically the connection pads 2 of the substrate 10 and the bonding pads 22 of the semiconductor chip 20 with each other. The bumps 30 may contain a metal having a low melting point, such as solder.

The coating layer 40 may be located on the entire exposed surface portions of the semiconductor chip 20 and on the entire exposed upper surface portions of the substrate 10. In addition, the coating layer 40 may be coated on the exposed surface portions of the bumps 30 which are connected to the bonding pads 22 of the semiconductor chip 20 and the connection pads 2 of the substrate 10.

Meanwhile, the coating layer 40 may be located on one surface of the substrate 10 which faces the semiconductor chip 20 and on one surface of the semiconductor chip 20 which faces the substrate 10. Alternatively, the coating layer 40 may be located either on one surface of the substrate 10 which faces the semiconductor chip 20 or on one surface of the semiconductor chip 20 which faces the substrate 10.

In the present embodiment, the coating layer 40 contains a hydrophilic material which has a hydroxyl radical (—OH). Alternatively, the coating layer 40 may contain a hydrophobic material.

The underfill member 50 is located in the gap which is defined between the substrate 10 and the semiconductor chip 20 due to the presence of the bumps 30. The substrate 10 and the semiconductor chip 20 are attached to each other by way of the underfill member 50 interposed therebetween to prevent the substrate 10 and the semiconductor chip 20 from being broken and/or damaged due to externally applied shocks and/or vibrations.

In the present embodiment, the underfill member 50 may contain a hydrophilic material or a hydrophobic material. For example, if the coating layer 40 contains a hydrophilic material, the underfill member 50 contains a hydrophilic material. On the contrary, if the coating layer 40 contains a hydrophobic material, the underfill member 50 contains a hydrophobic material.

When the coating layer 40 and the underfill member 50 contain a hydrophilic material or a hydrophobic material, the underfill member 50 may be easily filled over the coating layer 40 into the narrow gap defined between the substrate 10 and the semiconductor chip 20, and the air present in the narrow cap may be quickly discharged out of the gap. As a result, it is possible to prevent voids from being formed in the underfill member 50.

After the underfill member 50 is located between the substrate 10 and the semiconductor chip 20, the semiconductor chip 20 and the substrate 10 are covered by the molding material 60. In the present embodiment, the molding member 60 may contain epoxy resin, etc.

Figure 2:
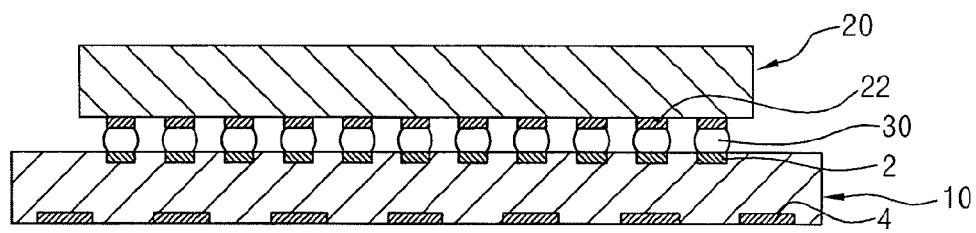
FIGS. 2 through 4 are cross-sectional views explaining a method for manufacturing a semiconductor package in accordance with another embodiment of the present invention.
Figure 3:
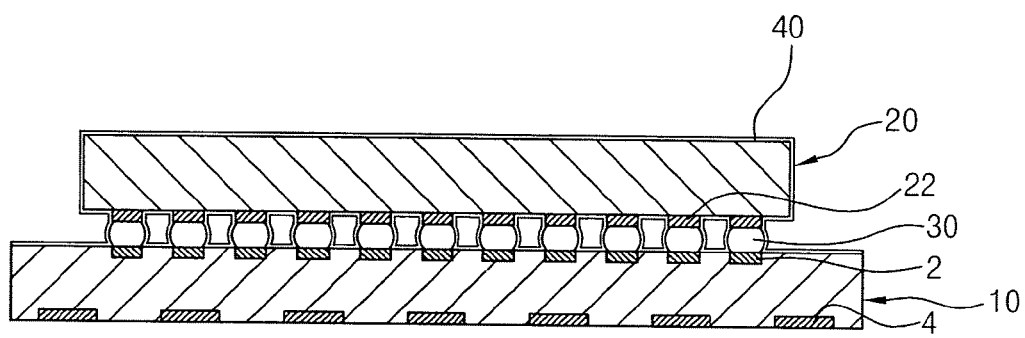
Figure 4:
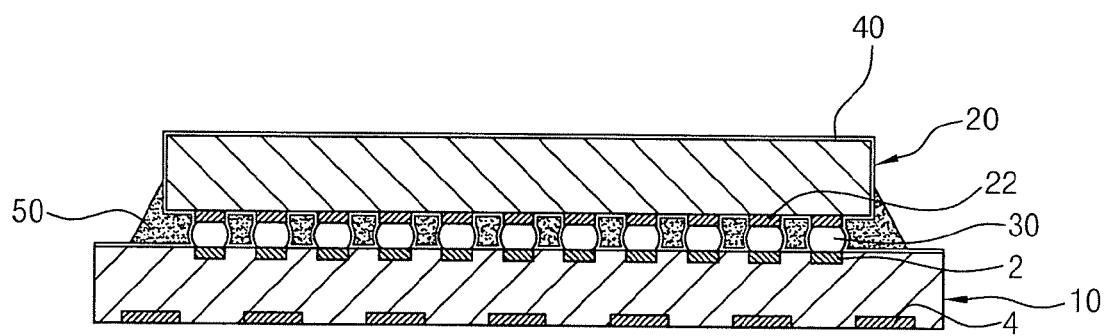

FIGS. 2 through 4 are cross-sectional views explaining a method for manufacturing a semiconductor package in accordance with another embodiment of the present invention.

Referring to FIG. 2, in order to manufacture the semiconductor package, a process for electrically connecting the substrate 10 and the semiconductor chip 20 with the each other by means of the bumps 30 is first conducted.

The substrate 10 may be a printed circuit board and has the shape of a plate. The connection pads 2 are formed on the upper surface of the substrate 10, and the ball lands 4 are formed on the lower surface of the substrate 10 which faces way from the upper surface.

The semiconductor chip 20 is formed with the data storage section and/or the data processing section through a semiconductor manufacturing process, and the bonding pads 22 are formed on the surface of the semiconductor chip 20 such that the bonding pads 22 are electrically connected with the data storage section and/or the data processing section. In the present embodiment, the bonding pads 22 are formed at positions on the semiconductor chip 20 which respectively correspond to the connection pads 2 of the substrate 10.

After the substrate 10 and the semiconductor chip 20 are manufactured, the bumps 30 are formed either on the connection pads 2 of the substrate 10 or on the bonding pads 22 of the semiconductor chip 20. The bumps 30 are electrically connected with the bonding pads 22 of the semiconductor chip 20 and the connection pads 2 of the substrate 10 through a reflow process.

Referring to FIG. 3, after the substrate 10 and the semiconductor chip 20 are connected with each other by means of the bumps 30, the coating layer 40 is formed on the substrate 10 and the semiconductor chip 20.

In the present embodiment, the coating layer 40 may be formed, for example, by a vacuum deposition process. In detail, the coating layer 40 may be formed by vaporizing a deposition material containing a hydrophilic material or a hydrophobic material and then depositing the vaporized deposition material on the substrate 10 and the semiconductor chip 20.

In the case of forming the coating layer 40 containing a hydrophilic material or a hydrophobic material through the vacuum deposition process, the coating layer 40 may be formed on the entire areas of the substrate 10 and the semiconductor chip 20. In particular, when the coating layer 40 is formed through the vacuum deposition process, the coating layer 40 may be precisely formed on the substrate 10 and the semiconductor chip 20 which defines a very narrow gap therebetween.

Alternatively, the coating layer 40 may be formed, for example, by a spin coating process. In detail, the coating layer 40 may be formed by dissolving a deposition material containing a hydrophilic material or a hydrophobic material into a solvent and then coating the dissolved deposition material on the substrate 10 and the semiconductor chip 20.

In the case of forming the coating layer 40 containing a hydrophilic material or a hydrophobic material through the spin coating process, the coating layer 40 may be formed on the entire areas of the substrate 10 and the semiconductor chip 20. In particular, when the coating layer 40 is formed through the spin coating process, the coating layer 40 may be precisely formed on the substrate 10 and the semiconductor chip 20 which defines a very narrow gap therebetween.

Referring to FIG. 4, after forming the coating layer 40 on the substrate 10 and the semiconductor chip 20, the underfill material is filled and baked between the substrate 10 and the semiconductor chip 20, by which the underfill member 50 is formed.

The underfill material is changed depending upon the kind of material contained in the coating layer 40. For example, when the coating layer 40 contains a hydrophilic material, the underfill material also contains a hydrophilic material. On the contrary, if the coating layer 40 contains a hydrophobic material, the underfill material also contains a hydrophobic material.

Therefore, the underfill material, which is selected in conformity with the kind of material contained in the coating layer 40, may be easily filled between the substrate 10 and the semiconductor chip 20 which defines the very narrow gap therebetween, whereby it is possible to prevent voids from being formed in the underfill member 50.

Referring again to FIG. 1, after the coating layer 40 and the underfill member 50 are formed, the molding member 60 for covering the substrate 10 and the semiconductor chip 20 is formed, and the solder balls 6 are connected to the ball lands 4 of the substrate 10, whereby the manufacture of the semiconductor package is completed.

While it was described in the method for manufacturing a semiconductor package according to the above embodiment of the present invention that the coating layer 40 is formed after bonding the substrate 10 and the semiconductor chip 20 with each other, a person having ordinary knowledge in the art will appreciate that the coating layer 40 may be formed before bonding the semiconductor chip 20 and the substrate 10 with each other.

As is apparent from the above description, in the present invention, after a coating layer for preventing formation of voids is formed on a semiconductor chip and a substrate which face each other and between which a narrow gap is defined, an underfill material is filled in the gap between the semiconductor chip and the substrate to form an underfill member. Therefore, since it is possible to prevent voids or moisture from being trapped in the underfill member, the reliability of a semiconductor package may be significantly improved.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor package comprising:
   a substrate having connection pads formed on an upper surface thereof;
   a semiconductor chip having bonding pads formed on a lower surface that faces the upper surface of the substrate, and each of the bonding pads corresponding to the connection pads;
   bumps for electrically connecting the connection pads and the bonding pads with each other;
   a coating layer located on the upper surface of the substrate and the lower surface of the semiconductor chip, respectively;
   an underfill member filled in spaces between the substrate and the semiconductor chip over the coating layer for preventing voids from being formed in the spaces; and
   wherein the underfill member and the coating layer contain a hydrophilic material having a hydroxyl radical.

2. A semiconductor package comprising:
   a substrate having connection pads formed on an upper surface thereof;
   a semiconductor chip having bonding pads formed on a lower surface that faces the upper surface of the substrate, and each of the bonding pads corresponding to the connection pads;
   bumps for electrically connecting the connection pads and the bonding pads with each other;
   a coating layer located on the upper surface of the substrate and the lower surface of the semiconductor chip, respectively;
   an underfill member filled in spaces between the substrate and the semiconductor chip over the coating member for preventing voids from being formed in the spaces; and
   wherein the underfill member and the coating layer contain a hydrophobic material.

3. The semiconductor package according to claim 1, wherein the coating layer is also formed on exposed surface portions of the bumps.

4. The semiconductor package according to claim 1, wherein the substrate and the semiconductor chip are molded using a molding material.

5. A method for manufacturing a semiconductor package, comprising the steps of:
   connecting connection pads formed on an upper surface of a substrate and bonding pads formed on a lower surface, which faces the upper surface of the substrate of a semiconductor chip by means of bumps;
   applying a coating material and thereby forming a coating layer on exposed surface portions between the upper surface of the substrate and the lower surface of the semiconductor chip to prevent voids from being formed in spaces between the upper surface of the substrate and the lower surface of the semiconductor chip;
   filling an underfill material in the spaces over the coating layer and thereby forming an underfill member without any voids; and wherein, in the step of forming the coating layer and the step of forming the underfill member, the coating material and the underfill material contain a hydrophilic material having a hydroxyl radical.

6. A method for manufacturing a semiconductor package, comprising the steps of:

connecting connection pads formed on an upper surface of a substrate and bonding pads formed on a lower surface, which faces the upper surface of the substrate, of a semiconductor chip by means of bumps;

applying a coating material and thereby forming a coating layer on exposed surface portions between the upper surface of the substrate and the lower surface of the semiconductor chip to prevent voids from being formed in spaces between the upper surface of the substrate and the lower surface of the semiconductor chip;

filling an underfill material in the spaces over the coating layer and thereby forming an underfill member without any voids; and wherein, in the step of forming the coating layer and the step of forming the underfill member, the coating material and the underfill material contain a hydrophobic material.

7. The method according to claim 5, wherein, in the step of forming the coating layer, the coating layer is formed through a vacuum deposition process.

8. The method according to claim 5, wherein, in the step of forming the coating layer, the coating layer is formed through a spin coating process.

9. The method according to claim 5, wherein the coating layer is also formed on exposed surface portions of the bumps.

10. A method for manufacturing a semiconductor package, comprising the steps of:

forming connection pads on an upper surface of a substrate and bonding pads on a lower surface of a semiconductor chip;

applying a coating material for preventing voids from being formed in a space between the substrate and the semiconductor chip, on the upper surface of the substrate and the lower surface of the semiconductor chip, and thereby forming a coating layer on each of the upper surface of the substrate and the lower surface of the semiconductor chip;

connecting the connection pads and the bonding pads with each other by means of bumps;

forming an underfill member without any voids by filling an underfill material in the space over the coating layer; and wherein, in the step of forming the coating layer and the step of forming the underfill member, the coating material and the underfill material contain a hydrophilic material having a hydroxyl radical.

\* \* \* \* \*